United States Patent [19]

Kirby

[11] 4,312,032

[45] Jan. 19, 1982

[54] RF POWER CONTROL APPARATUS

[75] Inventor: Thomas J. Kirby, Pelham, N.H.

[73] Assignee: GTE Products Corporation, Stamford, Conn.

[21] Appl. No.: 792,510

[22] Filed: May 2, 1977

[51] Int. Cl.³ .......................................... H02M 7/537
[52] U.S. Cl. ..................................... 363/97; 363/134
[58] Field of Search ............... 219/10.77; 323/20, 102, 323/271, 272, 282, 283, 285; 363/79, 80, 123, 133, 134, 24, 25, 97

[56] References Cited

U.S. PATENT DOCUMENTS

| | | | |
|---|---|---|---|
| 3,718,852 | 2/1973 | Bailey | 363/80 |
| 3,921,070 | 11/1975 | Ringstad et al. | 323/102 X |
| 3,921,092 | 11/1975 | Schatz | 219/10.77 X |
| 3,959,720 | 5/1976 | Bose et al. | 323/102 |
| 4,055,795 | 10/1977 | Mathieu | 323/102 |

*Primary Examiner*—A. D. Pellinen
*Attorney, Agent, or Firm*—David M. Keay

[57] ABSTRACT

Apparatus for providing a controlled dynamically programmable RF power level to the real part of a terminating load which may vary in impedance over a wide range. Immitance monitoring apparatus produces vector signals representing instantaneous measurements of the voltage and current of an RF signal supplied to a load by an RF generator. These signals which contain information on the phase relationship between the voltage and current are appropriately processed and then multiplied to produce a DC signal which represents the power of the RF signal. The DC signal is employed to control the gain of a variable gain RF amplifier connected between the RF generator and the immitance monitoring apparatus. A feedback control loop is thus provided which controls the power of the RF signal supplied to the load. By amplifying, or attenuating, the signals present at some point in the control loop, the amount of power delivered to the load may be selectively varied.

9 Claims, 9 Drawing Figures

RF POWER CONTROL APPARATUS

BACKGROUND OF THE INVENTION

This invention relates to apparatus for controlling RF signals. More particularly, it is concerned with apparatus for controlling the power supplied to a load by an RF signal generator.

In the past it has been difficult to provide precise control of the power supplied to a load, particularly a load of varying impedance, by an RF signal. Feedback control techniques have been employed to obtain approximate power control using an error signal derived as a function of the output voltage or the output current from the RF signal source. Error signals for feedback control have also been developed from the reflected and forward waves on a transmission line. This technique permits approximate power control over a limited dynamic range.

The foregoing methods provide only indirect approximations of the RF power delivered to the terminating load and only over a relatively narrow range of load impedance. In addition, the limited control function of these techniques can be effectively implemented over only a restricted power range and a restricted bandwidth.

SUMMARY OF THE INVENTION

Apparatus in accordance with the present invention controls the power of an RF signal supplied to a load over wide variations of load impedance and over wide ranges of output power and bandwidth. The apparatus includes an RF generating means which produces an RF signal to be supplied to the load. The apparatus also includes a control loop having a sensing means which is coupled between the RF generating means and the load and which produces immittance signals that provide information on the voltage, current, and phase of the RF signal being supplied by the RF generating means to the load. A power signal means is coupled to the sensing means to combine the immittance signals so as to produce a power signal which is related to the power of the RF signal being supplied by the RF generating means to the load. The control loop also includes RF control means coupled to the power signal means and to the RF generating means. The RF control means responds to the power signal from the power signal means so as to vary the RF signal supplied by the RF generating means to the load in a manner to maintain the power of the RF signal supplied to the load substantially constant.

BRIEF DESCRIPTION OF THE DRAWINGS

Additional objects, features, and advantages of apparatus for controlling the power of an RF signal supplied to a load in accordance with the present invention will be apparent from the following detailed discussion together with the accompanying drawing wherein.

DETAILED DESCRIPTION OF THE INVENTION

Figure 1:
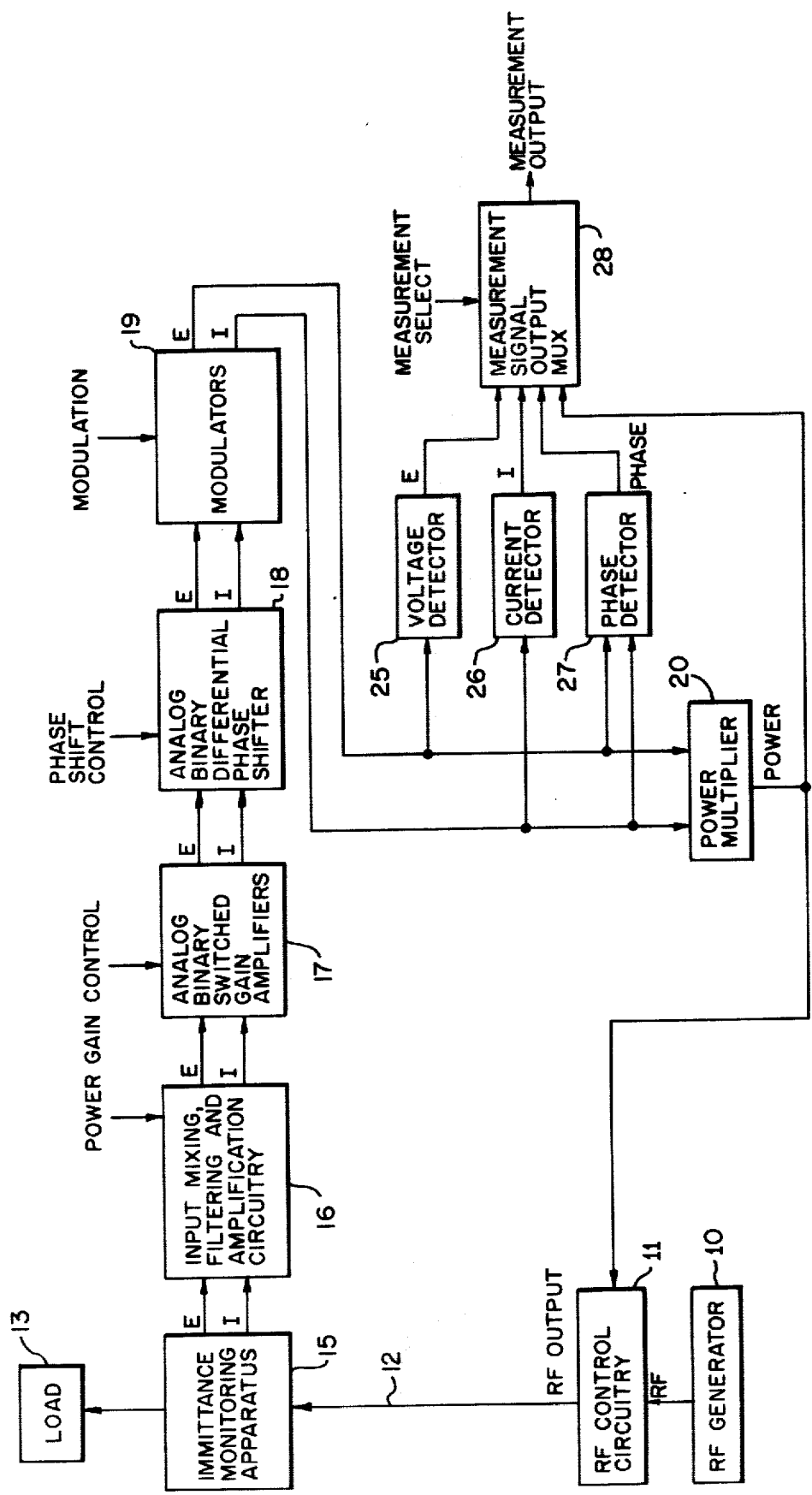
FIG. 1 is a block diagram of RF power control apparatus in accordance with the present invention.

RF power control apparatus in accordance with the present invention is illustrated in block diagram form in FIG. 1. The apparatus includes an RF generator 10 for producing an RF signal. The RF signal from the RF generator is applied to RF control circuitry 11 which operates in a manner to be explained in detail hereinbelow to control the RF power supplied to a load 13 over a transmission line 12.

An immittance monitoring apparatus 15 is coupled to the transmission line 12 between the RF control circuitry 11 and the load 13. The immittance monitoring apparatus senses the instantaneous voltage and current of the RF signal on the transmission line and produces analog voltage and current signals E and I which represent the instantaneous values of voltage and current. Thus, the signals E and I contain information on the voltage, current, and phase of the RF signal being supplied to the load 13. The immittance monitoring apparatus 15 and the RF control circuitry 11 are elements of a control loop by which parameters of the RF signal in the transmission line 12 are detected, the information processed to produce a corresponding DC power signal, and the power signal applied to the RF control circuitry 11 to control the power of the RF signal supplied by the RF generator 10 to the load 13.

The E and I signals from the immittance monitoring apparatus 15 are applied to input mixing, filtering, and amplification circuitry 16 where they are mixed to a common IF and amplified or attenuated to a convenient processing amplitude. The E and I signals are then applied to analog binary switched gain amplifiers 17, one for each signal E and I. The gain of the amplifiers 17 and consequently the RF power supplied to the load 13 is controlled by binary POWER GAIN CONTROL signals which are applied to amplifier 17 and also to amplifiers in section 16. The E and I signals are then applied to an analog binary differential phase shifter 18. The phase shifter 18 is controlled by PHASE SHIFT CONTROL signals so as to adjust the phase relationship between the E and I signals in a manner to correct for phase errors introduced by elements in the control loop and thus preserve the phase information in the E and I signals.

Modulators 19, one for each signal E and I, are shown positioned in the control loop following the differential phase shifter 18. The modulators amplitude modulate the E and I signals in accordance with an applied MODULATION signal. The modulators provide a means of modulating the RF signal supplied to the load by modulating the control loop signal rather than directly modulating the RF signal itself.

The E and I signals are applied to a power multiplier 20 which combines the E and I signals representing instantaneous values of voltage and current to produce a DC control signal. This calculated POWER signal is an exact representation of the resistive power flowing to the load 13.

The POWER signal from the power multiplier 20 is applied to the RF control circuitry 11. In the RF control circuitry 11 the DC POWER signal first may be smoothed by an integrator circuit and then utilized to control the gain of an RF variable gain amplifier which amplifies the RF signal from the generator 10. The output of the variable gain amplifier is amplified to the desired output level and applied to the transmission line 12, thereby completing the control loop. The control loop operates to maintain the resistive power delivered to the load 13 at a constant level despite variations in the real or imaginary parts of the load impedance. The power level may be altered selectively by POWER GAIN CONTROL signals applied to the analog binary switched gain amplifiers 17.

Voltage, current, phase, and power information can be obtained from the control loop signals to provide instantaneous information concerning the terminating load impedance. As shown in FIG. 1, the voltage and current signals E and I may be applied to a voltage detector 25 and a current detector 26, respectively, and both signals may be applied to a phase detector 27. These detectors produce DC measurement signals representing the voltage, current, and phase, respectively, of the RF signal in the transmission line 12. The outputs of the detectors 25, 26, and 27 and the POWER output signal from the power multiplier 20 may be applied to a measurement signal output multiplexer 28. Any one of these measurement signals may be selected to appear at the output of the multiplexer 28 as determined by MEASUREMENT SELECT signals. This information is obtained without interfering with the operation of the control loop in stabilizing the power supplied to the load.

In a specific embodiment of the apparatus a conventional RF signal generator 10 is employed. The apparatus may operate with an RF signal of from 0.5 to 50 MHz and the power delivered to the load may be in the range of from 0.01 to 1000 watts CW. The normalized impedance of the terminating load 13 may vary over a range which lies within the locus of the 20:1 VSWR circle on the normalized Smith chart.

The immittance monitoring apparatus 15 of the feedback control loop senses the RF signal in the transmission line 12 and produces instantaneous analogs of the vector voltage and the vector current. Since the analog signals E and I represent the instantaneous values of the voltage and current they also contain information on the phase relationship between the voltage and current. Specific apparatus for sensing these parameters and producing suitable immittance signals E and I is disclosed and claimed in application Ser. No. 763,857 filed Jan. 31, 1977 by Thomas J. Kirby entitled "Immittance Monitoring Apparatus" now U.S. Pat. No. 4,088,950 and assigned to the assignee of the present invention. As explained in the above-mentioned application the apparatus provides accurate data on voltage, current, and phase without introducing significant perturbations in the RF signal being transmitted on the transmission line.

Figure 2:
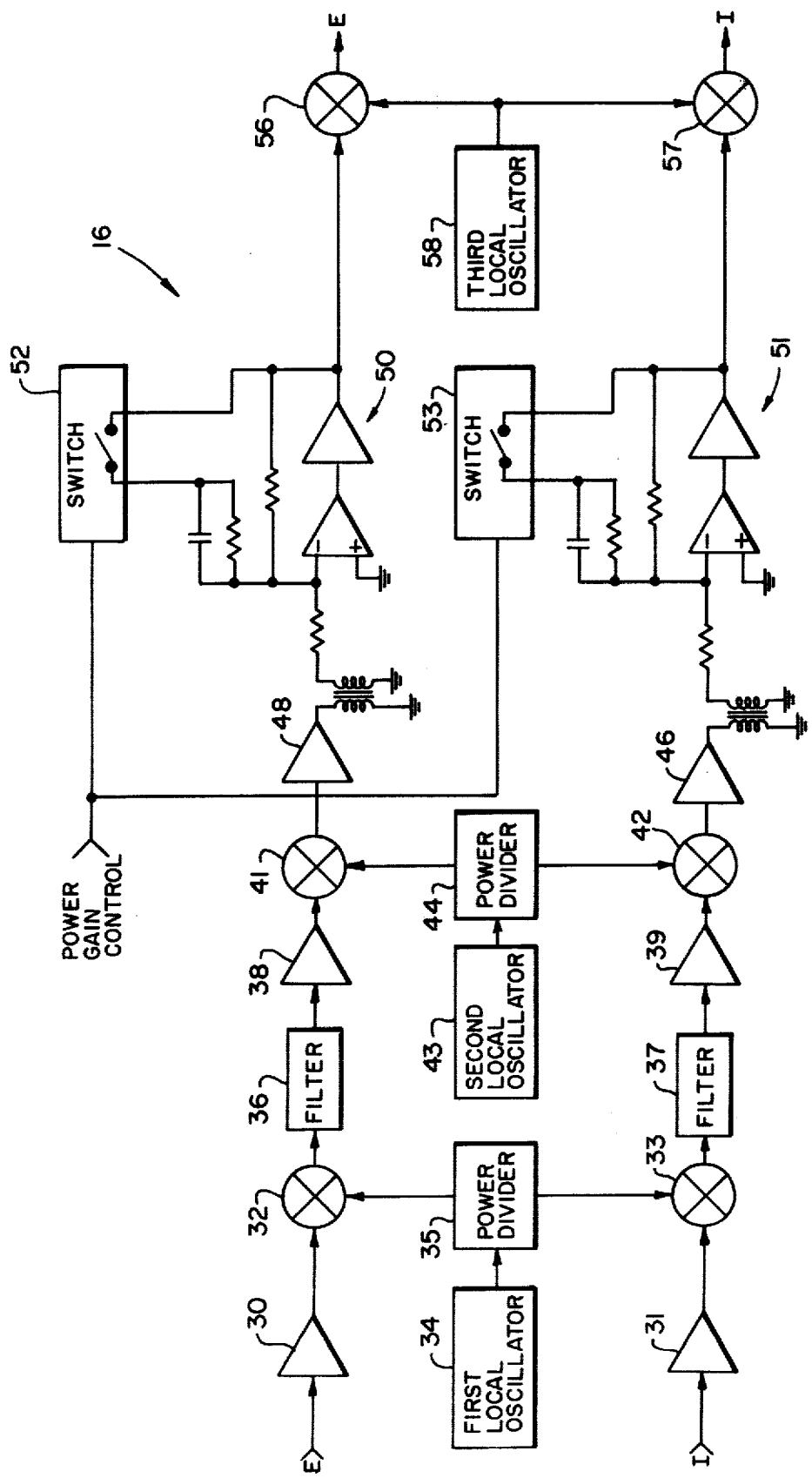
FIG. 2 is a schematic diagram illustrating input mixing, filtering, and amplification circuitry in the control loop of the apparatus.

The signals E and I from the immittance monitoring apparatus 15 representing the instantaneous values of voltage and current are applied to the input mixing, filtering, and amplification circuitry 16, a specific embodiment of which is illustrated in detail in the schematic diagram of FIG. 2. The E and I signals at the RF frequency are passed through amplifiers 30 and 31 and applied to mixers 32 and 33, respectively. In the mixers they are mixed with the signal from a first local oscillator 34 and applied to the mixers by way of a power divider 35. In a specific embodiment of the present invention the frequency of the RF signal is between 1 and 40 MHz and that of the first local oscillator is correspondingly varied between 81 and 120 MHz to provide an RF frequency from the mixers 32 and 33 of 80 MHz. The output signals from the mixers 32 and 33 are applied to filters 36 and 37 having a 25 KHz bandwidth and the resulting 80 MHz IF signals are applied to amplifiers 38 and 39.

The amplified 80 MHz IF signals E and I are applied to second mixers 41 and 42, respectively. In the mixers the signals are mixed with a signal of 80.510 MHz from a second local oscillator 43 applied to the mixers by way of a power divider 44. The resulting IF output signals of 510 KHz are amplified by amplifiers 48 and 46 which in turn are transformer coupled to controllable gain amplifiers 50 and 51.

Each of the identical amplifiers 50 and 51 has two alternative feedback paths, the selection of which is controlled by digital switches 52 and 53, respectively. The switches are both controlled by a binary POWER GAIN CONTROL signal. The component values of the feedback paths are such that when the switches 52 and 53 are closed, the amplifiers each provide +18 db gain. When the switches 52 and 53 are open, the amplifiers each provide −14 db gain. The appropriate gain of the amplifiers 50 and 51 is selected in accordance with the overall gain desired in the control loop in combination with the analog binary switched gain amplifiers 17.

The E and I signals from the amplifiers 50 and 51 are applied to third mixers 56 and 57, respectively, where they are mixed with a signal of 555 KHz from a third local oscillator 58. The resulting IF signals of 45 KHz are applied to analog binary switched gain amplifiers 17.

Figure 3:
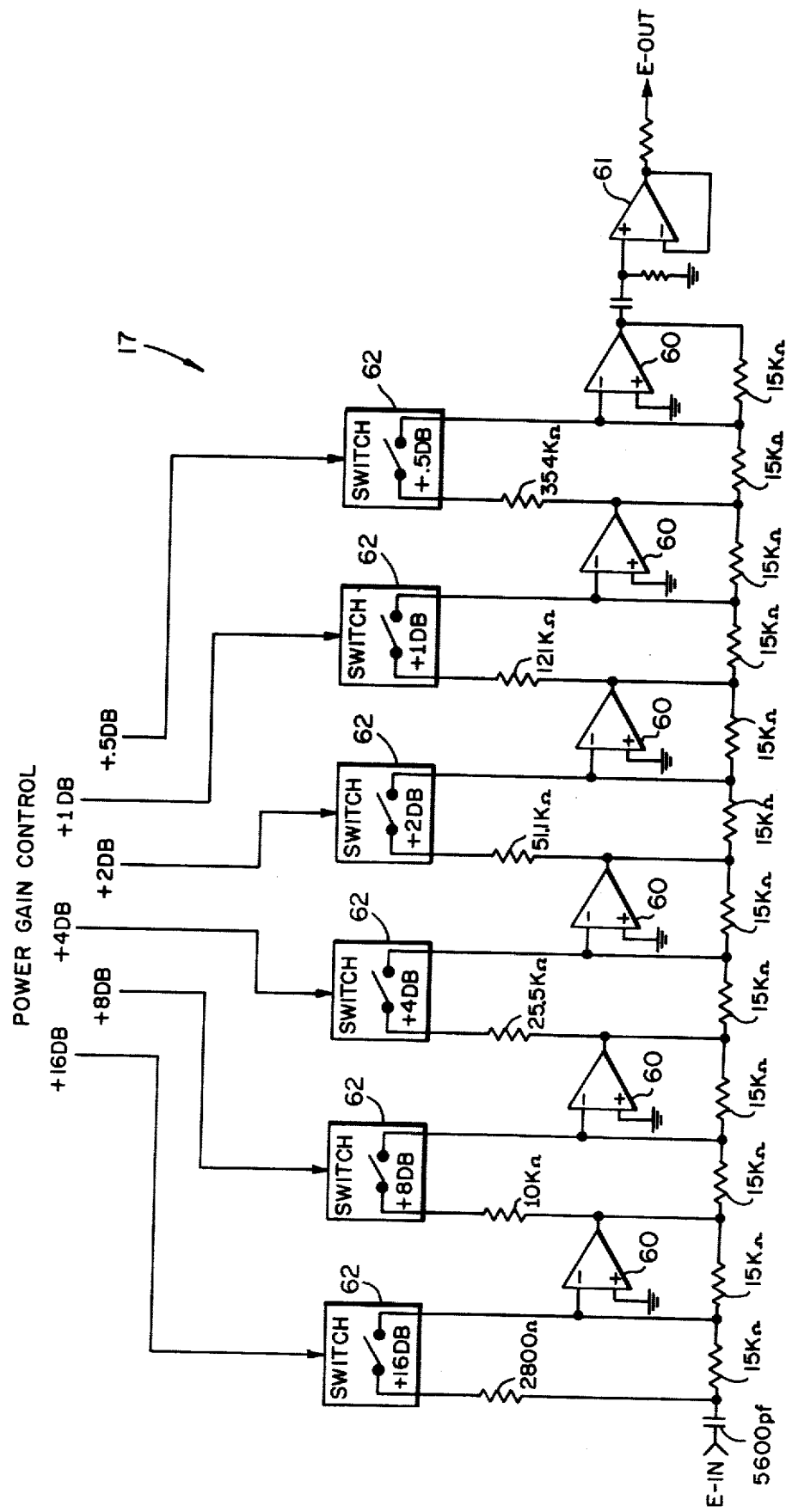
FIG. 3 is a schematic diagram illustrating one of two analog binary switched gain amplifiers in the control loop of the apparatus.

There are two identical analog binary switched gain amplifiers 17, one for the E signal and one for the I signal, controlled in common by POWER GAIN CONTROL signals. One of the amplifiers is illustrated in detail in the schematic diagram of FIG. 3. The amplifier includes six amplifier stages 60 connected in series as shown and an output driving stage 61. The amplifier stages 60 may employ type 747 internally compensated operational amplifiers and the output driving stage 61 may employ a type CA3100 operational amplifier.

The six amplifier stages 60 have appropriate values of input resistance so as to provide different amounts of gain, specifically, +16, +8, +4, +2, and +0.5 db, respectively. Individual amplifier stages 60 are selectively employed in the signal path by actuation of associated digitally controlled switches 62. Each switch 62 is controlled by a digital POWER GAIN CONTROL signal. Thus, by appropriate application of POWER GAIN CONTROL signals to the controlled gain amplifiers 50 and 51 (FIG. 2) and to the two analog binary switched gain amplifiers 17 a range of 63.5 db of gain in 0.5 db steps is obtainable.

The E and I signals from the analog binary switched gain amplifiers 17 are applied to an analog binary differential phase shifter 18. The phase shifter 18 is controlled by binary PHASE SHIFT CONTROL signals so as to alter the phase relationship between the E and the I signals. The primary purpose for adjusting the phase relationship is to compensate for differential phase shifts which occur in the control loop.

Figure 4:
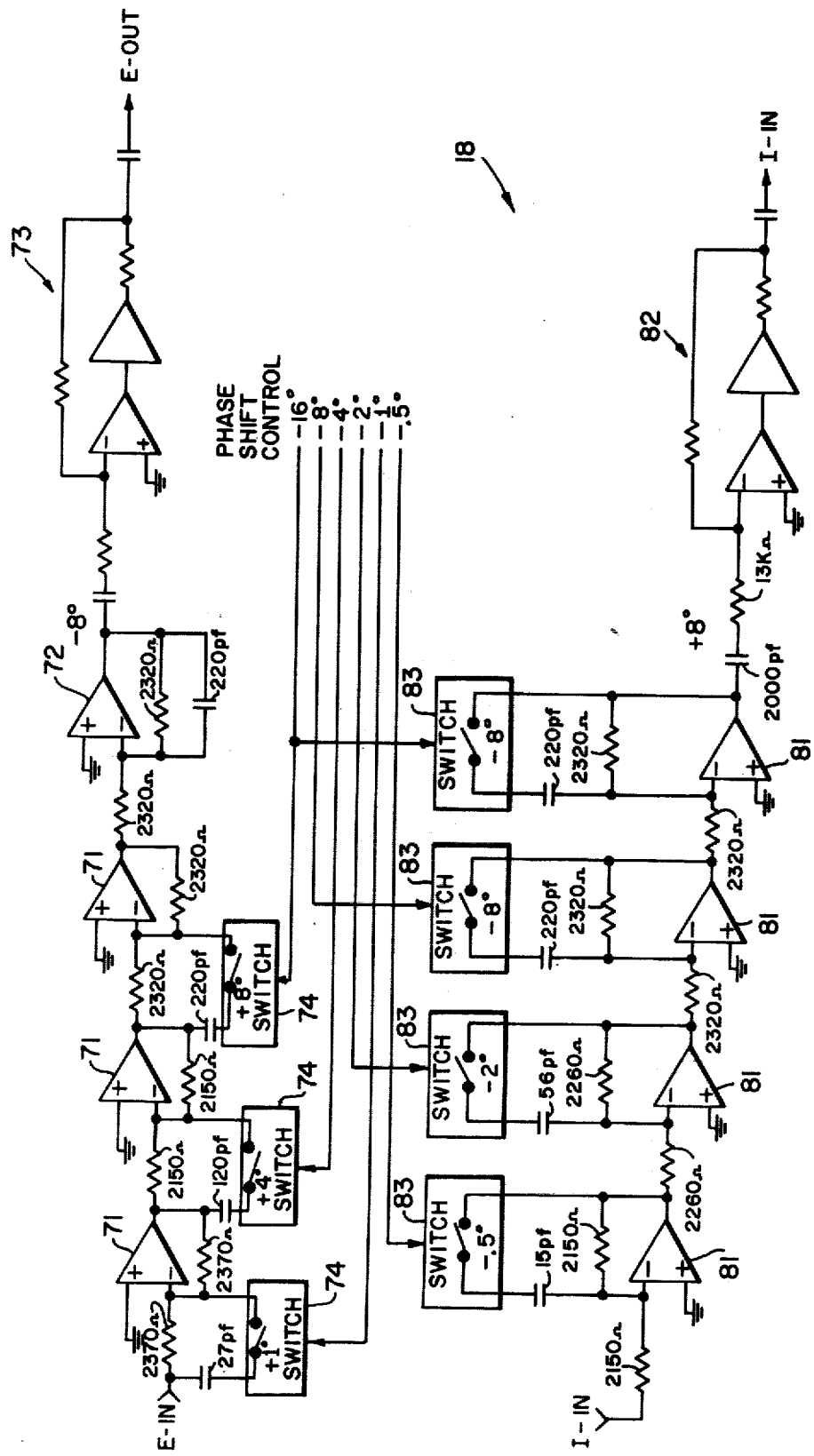
FIG. 4 is a schematic diagram of a phase shifter employed in the control loop of the apparatus.

The phase shifter 18 is illustrated in detail in the schematic diagram of FIG. 4. The phase shifter includes a path for the E signal through a series of three amplifier stages 71, a fourth amplifier stage 72, and a driving stage 73. Each of the amplifier stages 71 and 72 is capable of producing a phase lead or phase lag of the E signal as determined by the RC product of parallel resistance and capacitance in its input or feedback circuit, respectively. A binary controlled switch 74 is associated with each of the three amplifiers 71 and when in a closed condition connects a capacitance into the input circuit causing a predetermined phase lead of the E signal as indicated. Amplifier stage 72 together with associated feedback components provides a fixed value of phase lag of the E signal as indicated.

The path of the I signal through the phase shifter 18 includes a series of four amplifier stages 81 and a driver stage 82. A binary controlled switch 83 is associated with each of the four amplifier stages 81 and when closed connects a capacitance into the associated feedback circuit to produce a phase lag of the I signal as indicated. A fixed amount of phase lead of the I signal as indicated is provided by the components coupling the fourth of the amplifier stages 81 to the output driving stage 82.

The switches 74 and 83 are selectively opened or closed by binary PHASE SHIFT CONTROL signals. When no signals are present (all switches 74 and 83 open) a maximum phase shift of $+16°$ (I signal leading the E signal) is obtained. Changes from the $+16°$ phase shift are obtained by appropriate binary signals to close switches and thus alter the phase shift as indicated from the maximum $+16°$ shift. Thus, the phase shift of the I signal with respect to the E signal may be varied between $+16°$ (I signal leading the E signal) and $-15.5°$ (I signal lagging the E signal) in increments of $0.5°$. The phase shifter thus permits compensation for phase distortions of the E and I signals introduced by elements in the control loop, whereby the phase information sensed by the immittance monitoring apparatus is restored to the E and I signal combination. The analog binary differential phase shifter is described and claimed in copending application Ser. No. 792,509 filed May 2, 1977 by Thomas J. Kirby entitled "Variable Phase Shifting Apparatus," now U.S. Pat. No. 4,101,821 and assigned to the assignee of the present application.

Figure 5:
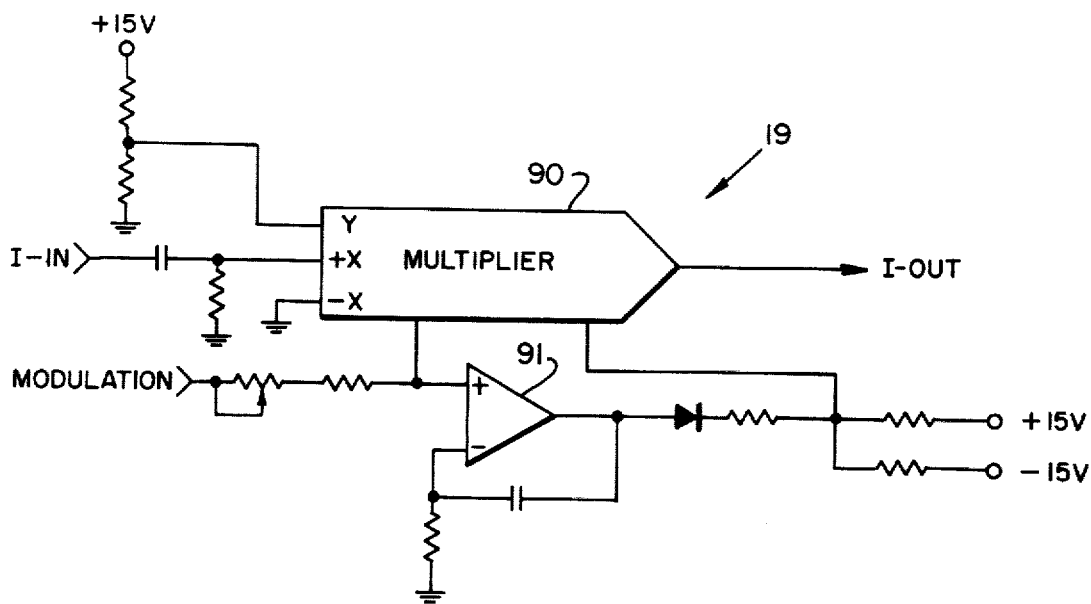
FIG. 5 is a schematic diagram illustrating one of a pair of identical modulators which may be employed in the control loop of the apparatus.

The E and I signals from the phase shifter 18 may be applied to identical amplitude modulators 19, one of which is shown in the schematic diagram of FIG. 5. The modulator 19 includes a multiplier 90, specifically an AD531S four quadrant transconductance multiplier. The I signal is applied to one input of the multiplier 90 and fixed voltages are applied to the other inputs as shown. The MODULATION signal, which is the same for both modulators, is applied to the input of an operational amplifier 91, type 747, and together with the output of amplifier 91 to the scaling terminals of the multiplier 90. The modulator as shown is of known design and operates to produce an output which is the product of the Y and $+X$ inputs divided by a scaling factor determined by the inputs to the scaling terminals. Thus the output signal is the I signal amplitude modulated by the MODULATION signal.

Figure 6:
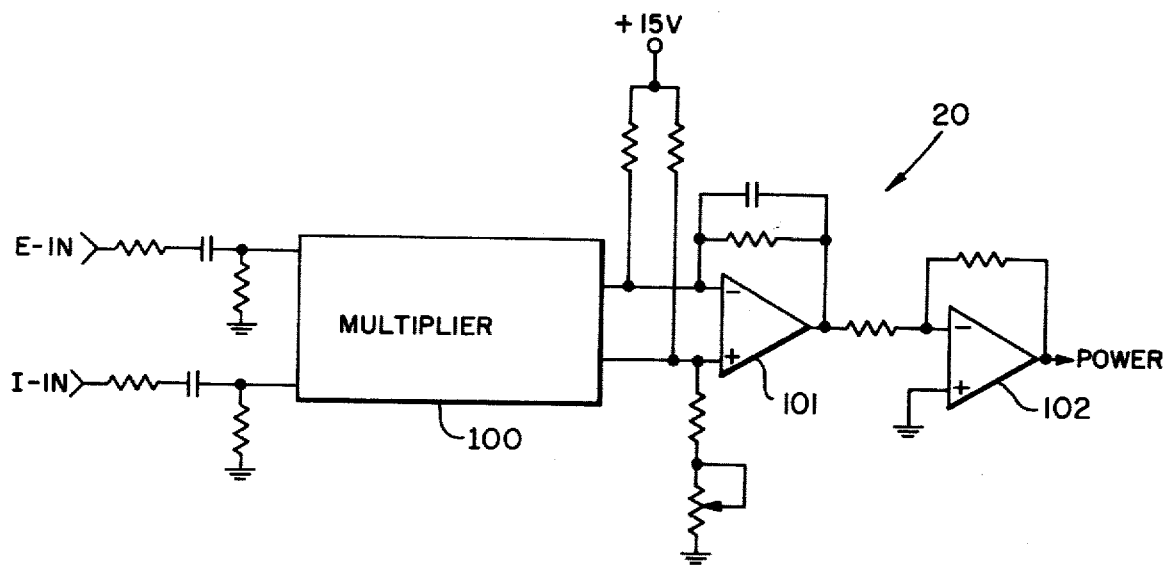
FIG. 6 is a schematic diagram of a power multiplier employed in the control loop of the apparatus.

The outputs of the two modulators 19 are applied to the power multiplier 20 which is illustrated in detail in the schematic diagram of FIG. 6. The power multiplier 20 includes a multiplier 100, specifically a type MC1595 four quadrant transconductance multiplier. The E and I signals are applied to the multiplier 100 which produces a differential output signal equal to the product of the input signals. The differential output from the multiplier 100 is applied to a balanced input operational amplifier 101, type 747, to produce a single ended output and further amplified by an amplifier 102, type 747. The resulting POWER signal is a filtered DC error signal equal to $kEI \cos \phi$, where k is a constant related to the gain of the preceeding processing circuitry and $\phi$ is the phase angle between the E and I vector signals. This calculated POWER signal is an exact representation of the resistive power flowing to the terminating load 13.

Figure 7:
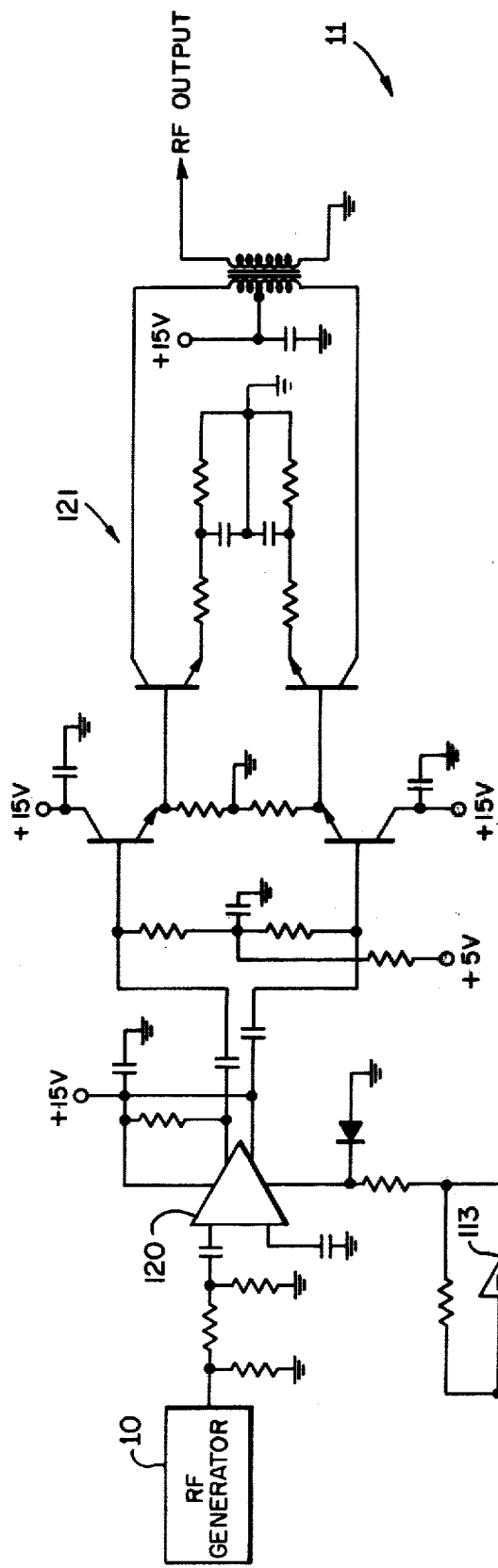
FIG. 7 is a schematic diagram of RF control circuitry in the control loop of the apparatus.
Figure 7:
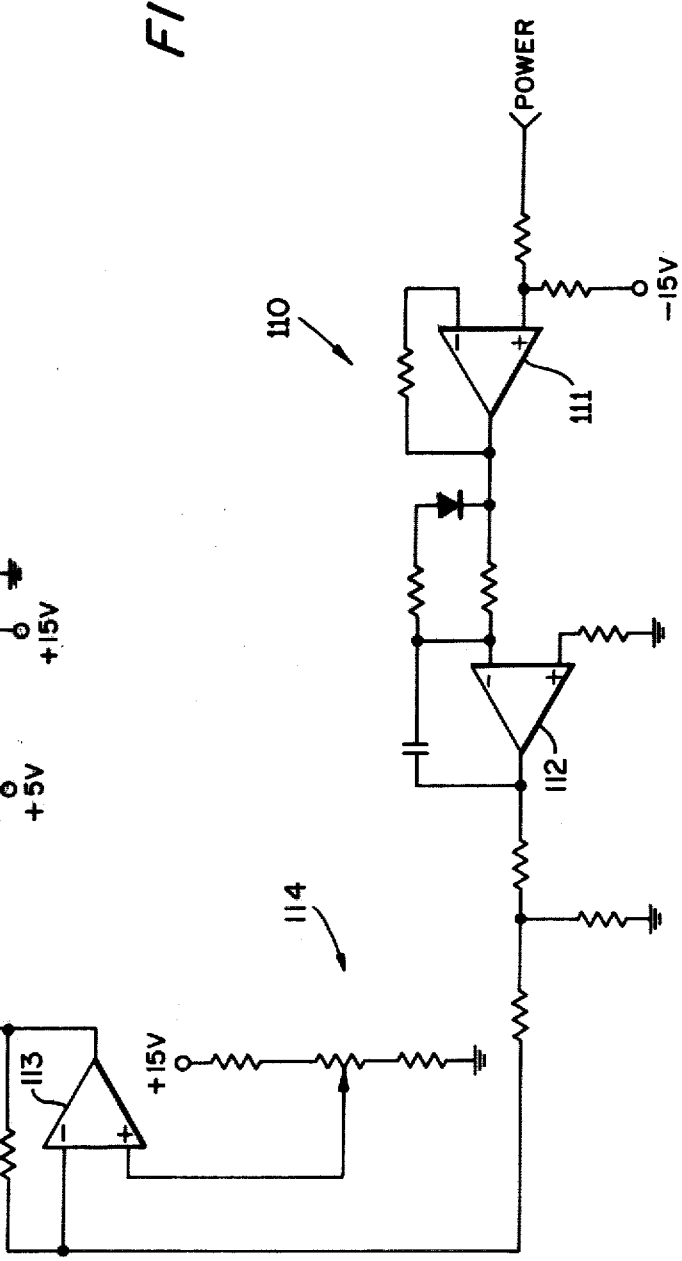

The POWER signal from the power multiplier 20 is applied to the RF control circuitry 11 which is shown in detail in the schematic diagram of FIG. 7. The RF control circuitry 11 includes an integrator section 110 of two type 747 operational amplifiers 111 and 112. The first amplifier stage 111 provides a high input impedance for the POWER signal and adds a fixed increment of voltage. The second amplifier 112 and associated components form an integrator/filter arrangement which produces high gain at low frequencies and the integration or smoothing of abrupt or step changes in the POWER signal. The integrator is designed to exhibit the same time constant for positive-going and negative-going signals to provide a symmetrical response to these bipolar disturbances.

The integral of the POWER signal from the integrator section 110 is applied to a type 747 operational amplifier 113 where it is compared to a fixed reference voltage from a source 114. The reference level is chosen so as to center the processing signals in the dynamic range of the DC control loop circuitry.

The output of the operational amplifier 113 is applied to the AGC input of an RF amplifier 120, specifically type MC1590. The amplifier receives the RF signal from the RF generator 10 which is of conventional design. The RF output of the RF amplifier 120 varies with the DC AGC voltage from the amplifier 113. The variable RF signal from the variable amplifier 120 is further amplified by a two-stage fixed gain RF amplifier section 121 of conventional design. The RF OUTPUT signal from the amplifier section 121 is coupled to the transmission line 12 thus completing the control loop.

Figure 8:
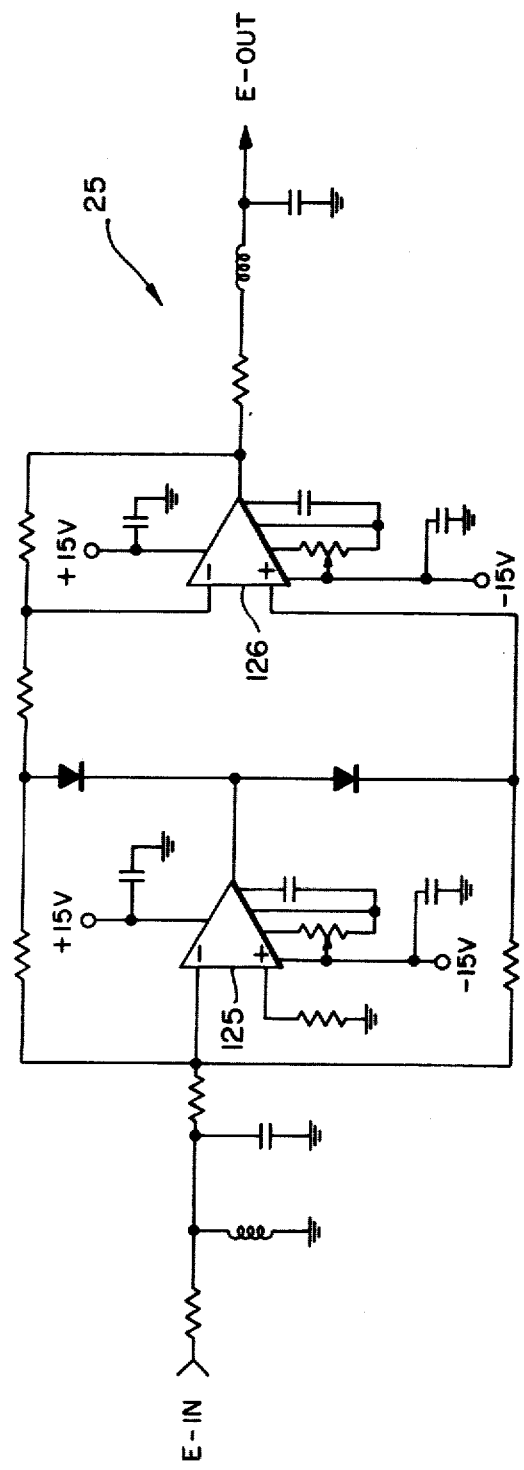
FIG. 8 is a schematic diagram of a voltage or current detector which may be employed with the apparatus.

As illustrated in FIG. 1 measurement signals indicating voltage, current, phase, and power may be extracted from the signals present in the control loop. FIG. 8 is a schematic diagram of a voltage detector 25 which receives the E signal from the modulator 19. The voltage detector 25 employs two operational amplifiers 125 and 126, specifically type CA3100, and associated components to provide full wave rectification plus filtering to produce a DC E signal which is a measure of the RF voltage sensed in the transmission line 12. A current detector 26 is identical to the voltage detector and operates in the same manner to convert the 45 KHz I signal from the modulator 19 to a DC I signal which is a measure of the RF current sensed in the transmission line 12.

Figure 9:
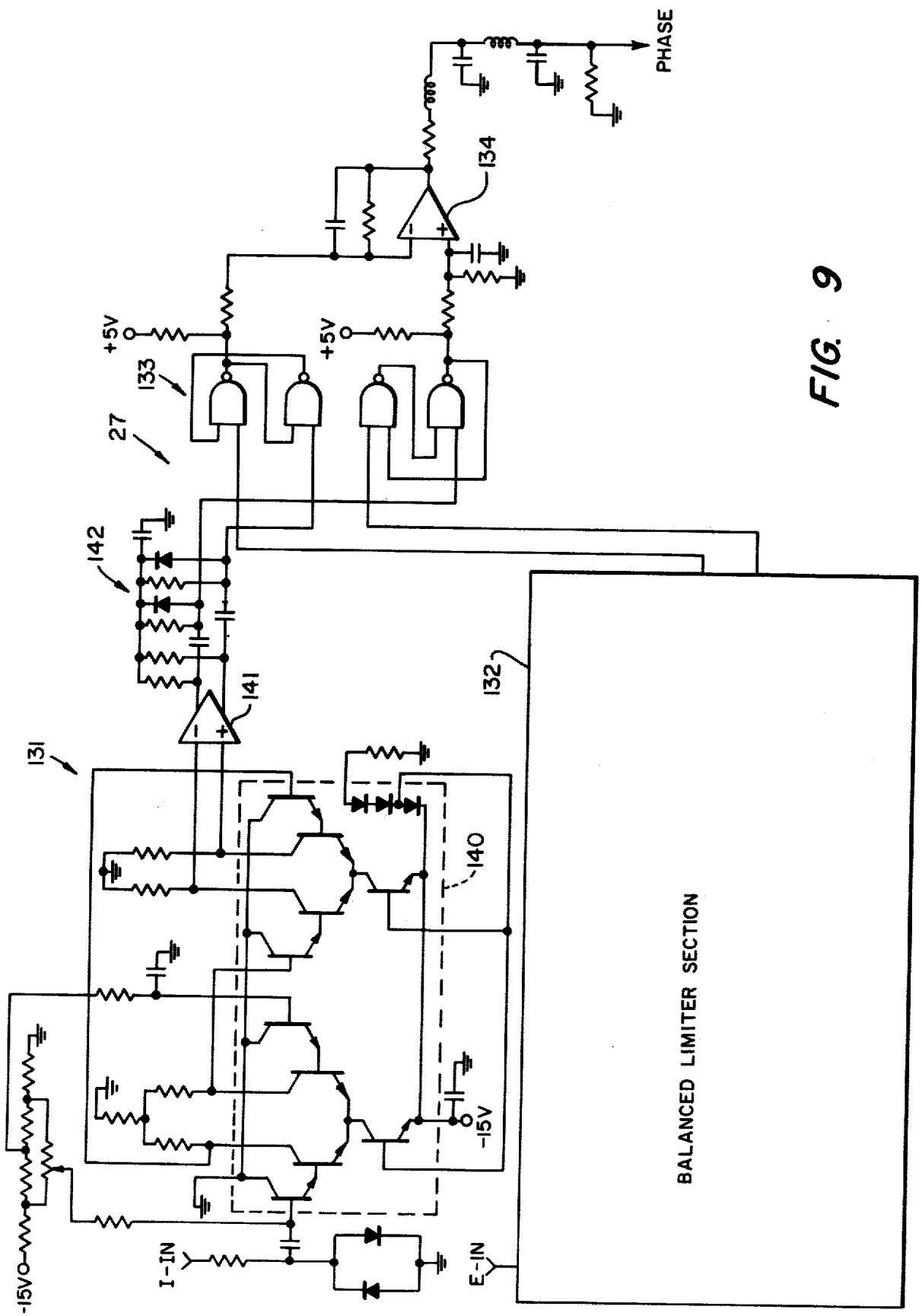
FIG. 9 is a schematic diagram of a phase detector which may be employed with the apparatus.

A phase detector 27 for determining the phase of the 45 KHz E and I signals and producing a PHASE measurement signal is illustrated in detail in the circuit diagram of FIG. 9. The phase detector includes a balanced limiter section 131 for the I signal. A limiter employing differential amplifiers 140, type CA3050, provides a differential input to a comparator 141, type LM161, the output of which is further limited by an arrangement 142. The E signal is similarly processed in an identical balanced limiter section 132. The differential outputs for the I and E signals from the balanced limiter sections 131 and 132, respectively, are applied to four NAND gates 133 which are connected to form two R/S flip-flops. The outputs of the flip-flops are coupled to an operational amplifier 134, type LM307, having a filtered output. The detector operates as a conventional phase detector to produce a DC PHASE signal which is a measure of the phase angle between the E and I vector signals.

The apparatus as shown and described produces a controlled dynamically programmable RF power level to the real part of a load. The load may vary over a wide range and the resistive power supplied to the load remains constant. The RF power level flowing into the load is selectively variable by POWER GAIN CONTROL signals. These signals alter the gain in the control loop causing a consequent adjustment of the power in the transmission line to balance the control loop. A positive gain step in the amplifiers of sections 16 and 17 results in a reduction of the power supplied to the load and a negative gain step in the amplifiers increases the delivered power. Amplification may take place at any convenient point in the control loop before the integrator.

As shown and described herein the RF signal supplied to the load may be amplitude modulated if desired by modulators 19 placed in the control loop between the phase shifter 18 and the power multiplier 20. Alternatively, modulation may be introduced at any other convenient point in the control loop.

While there has been shown and described what is considered a preferred embodiment of the present invention, it will be obvious to those skilled in the art that various changes and modifications may be made therein without departing from the invention as defined by the appended claims.

What is claimed is:

1. Apparatus for supplying a controlled RF signal to a load including in combination
RF generating means for producing an RF signal to be suplied to the load;
a control loop including
 sensing means coupled between the RF generating means and the load for producing a voltage signal representing the instantaneous voltage and a current signal representing the instantaneous current of the RF signal being supplied by the RF generating means to the load;
 power signal means coupled to the sensing means for combining said voltage and current signals to produce a power signal related to the power of the RF signal being supplied by the RF generating means to the load; and
 RF control means coupled to the power signal means and to the RF generating means, said RF control means including RF variable amplifier means connected between the RF generating means and the sensing means, the RF variable amplifier means being operable to vary the gain of the RF signal supplied by the RF generating means to the load in response to said power signal from the power signal means so as to maintain the power of the RF signal supplied to the load substantially constant.

2. Apparatus in accordance with claim 1 wherein said control loop includes
 variable gain means connected between the sensing means and the power signal means for selectively varying the amplitude of the voltage and current signals whereby the power of the RF signal supplied to the load is selectively variable.

3. Apparatus in accordance with claim 2 wherein said control loop includes
 phase shifting means connected between said sensing means and said power signal means for selectively altering the phase relationship between the voltage and current signals whereby changes in the phase of the voltage and current signals occurring within the control loop may be compensated for.

4. Apparatus in accordance with claim 3 wherein said RF control means further includes
 integrating means connected between the power signal means and the RF variable amplifier means for smoothing out abrupt changes in the power signal from the power signal means.

5. Apparatus in accordance with claim 3 wherein said control loop includes
 modulating means connected between the sensing means and the power signal means for receiving a modulation signal and for amplitude modulating said voltage and current signals in accordance with the received modulation signal.

6. Apparatus in accordance with claim 4 wherein
 said sensing means is operable to produce AC voltage and current signals; and
 said power signal means is operable to combine said AC voltage and current signals to produce a DC power signal.

7. Apparatus in accordance with claim 6 including
 mixing means coupled to the sensing means for altering the frequency of the AC voltage and current signals from the sensing means to a predetermined IF frequency which is the same for all values of frequency of said RF signal.

8. Apparatus in accordance with claim 7 further including
 voltage detection means coupled to said sensing means for producing a voltage measurement signal related to said voltage signal;
 current detection means coupled to said sensing means for producing a current measurement signal related to said current signal; and
 phase detection means coupled to said sensing means for producing a phase measurement signal related to the phase differential between the instantaneous voltage and instantaneous current represented by the voltage and current signals.

9. Apparatus in accordance with claim 8 including
 measurement signal output means coupled to said voltage detection means, said current detection means, and said phase detection means; and
 means coupled to said power signal means for producing a power measurement signal related to said power signal, said means being coupled to the measurement signal output means;
 said measurement signal output means being operable in response to control signals applied thereto to selectively produce said voltage measurement signal, said current measurement signal, said phase measurement signal, or said power measurement signal at an output terminal.

* * * * *